(12) United States Patent
Nitta et al.

(10) Patent No.: US 7,507,665 B2
(45) Date of Patent: Mar. 24, 2009

(54) METHOD OF MANUFACTURING ELECTRICAL PARTS

(75) Inventors: Koji Nitta, Osaka (JP); Shinji Inazawa, Osaka (JP); Yoshihiro Hirata, Osaka (JP); Kazunori Okada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 320 days.

(21) Appl. No.: 11/200,191

(22) Filed: Aug. 10, 2005

(65) Prior Publication Data

US 2006/0046455 A1    Mar. 2, 2006

(30) Foreign Application Priority Data

Sep. 1, 2004    (JP) ............... 2004-254653

(51) Int. Cl.
*H01L 21/4763*  (2006.01)
*H01L 21/44*  (2006.01)
(52) U.S. Cl. ................... 438/686; 438/650
(58) Field of Classification Search ........... 438/670, 438/674, 650, 52, 686
See application file for complete search history.

(56) References Cited

U.S. PATENT DOCUMENTS

| | | | | |
|---|---|---|---|---|
| 3,801,477 | A | * | 4/1974 | James et al. ............... 438/125 |
| 7,141,495 | B2 | * | 11/2006 | Peng et al. ................. 438/672 |
| 2003/0060040 | A1 | * | 3/2003 | Lee et al. ................... 438/650 |
| 2003/0078174 | A1 | * | 4/2003 | Park et al. ................... 510/176 |

OTHER PUBLICATIONS

Yasui, Manabu., et al. "Application of Nickel Electro-Forming For Micromachining." Hyomen Gijutu 2001, vol. 52, No. 11, pp. 734-737.

* cited by examiner

*Primary Examiner*—N Drew Richards
*Assistant Examiner*—Grant S Withers
(74) *Attorney, Agent, or Firm*—McDermott Will & Emery LLP

(57) ABSTRACT

A method of manufacturing electrical parts is provided, which method comprises the steps of: forming a photoresist on a part of the surface of a substrate; forming a metal layer on the surface of the substrate after the photoresist has been formed; removing a part of the metal layer; removing a metal oxide film formed on the: surface of the metal layer as a result of removing a part of the metal layer; and removing the photoresist. With this method the contact resistance on the surfaces of the electrical parts can be decreased.

5 Claims, 5 Drawing Sheets

METHOD OF MANUFACTURING ELECTRICAL PARTS

BACKGROUND OF THE INVENTION

1. Field of the Invention

The present invention relates to methods of manufacturing electrical parts, and particularly to manufacturing methods with which contact resistance on the surface of an electrical part can be decreased.

2. Description of the Background Art

In the past, lithography using ultraviolet irradiation was used for making fine electrical parts consisting of metals such as Ni (nickel) and Ni alloy with electroforming. However, in recent years, increasing need of electrical parts having higher precision and higher aspect ratio has attracted attention to the so-called LIGA (Lithographie Galvanoformung Abformung) process, in which lithography, plating such as electroforming, and molding are combined. It is possible to make electrical parts having sizes of micron order by the LIGA process, particularly by X-ray lithography using synchrotron radiation (SR).

An example of the methods of manufacturing electrical parts by the LIGA process using the X-ray lithography will be described below.

First, a photoresist is applied over the whole area of a surface of a conductive substrate made of Ni or the like. Subsequently, a mask in which patterning is provided in a predetermined shape is placed on the surface of the photoresist and SR light is irradiated from a position above the mask. Consequently, by removing the photoresist at the parts where SR light has been irradiated, the photoresist is patterned according to the predetermined shape, whereby a master die is formed. Thus, the X-ray lithography is accomplished. Subsequently, by performing electroforming using the master die, a metal layer is deposited on the surface of the substrate which is exposed without the photoresist being formed. In this case, the electroforming using the master die is performed by immersing the master die as a cathode in an electroforming bath to which metal for forming a metal layer is added, and by applying an electric current between the master die and an anode which is immersed separately apart from the master die in the electroforming bath. Then, the metal layer is partly removed by polishing the portion excessively deposited due to electroforming. (For example, refer to Application of Nickel Electro-forming for Micromachining by Manabu Yasui, Yasuo Hirabayashi, and Hiroyuki Fujita, "Hyomen Gijutu" 2001, Vol. 52, No. 11, pp.734-735.) (Note: The literal translation of "Hyomen Gijutu" means "surface technology.") Thereafter, the photoresist is removed by plasma ashing using a mixed gas of carbon tetrafluoride ($CF_4$) and oxygen ($O_2$), and the metal layer is removed from the substrate such that an electrical part is completed.

However, regarding an electrical part made by such a method as described above, there was the problem that the contact resistance of the surface thereof was high. As a result of earnest study about this problem, the present inventors have found that a metal oxide film is formed on the surface of the metal layer where the excessive portion thereof has been removed by above-mentioned polishing and that, during plasma ashing of the photoresist, the metal oxide film ($MO_x$; M represents metal, x is an integer) causes a reaction with hydrogen fluoride (HF), which is a decomposition product of ashing gas, such that $MO_x + 2xHF \rightarrow MF_{2x} + xH_2O$, whereby a metal fluoride film, which is represented by the chemical formula of $MF_{2x}$, is formed on the surface of the metal layer. Since the metal fluoride film is so compact and rigid that the removal thereof is difficult, it is desired to establish a method of manufacturing electrical parts in which no metal fluoride film is formed on the surfaces of the electrical parts.

SUMMARY OF THE INVENTION

In view of the above-mentioned situation, an object of the present invention is to provide a manufacturing method with which the contact resistance on the surface of an electrical part is decreased.

The present invention is a method of manufacturing electrical parts, comprising a step of forming a photoresist on a part of the surface of the substrate, a step of forming a metal layer on the surface of the substrate after the photoresist has been formed, a step of removing a part of the metal layer, a step of removing a metal oxide film which has been generated on the surface of the metal layer as a result of removing a part of the metal layer, and a step of removing the photoresist.

Here, in the manufacturing method of electrical parts according to the present invention, the metal layer may be formed on the surface of the substrate by electroforming.

Also, in the method of manufacturing electrical parts according to the present invention, the photoresist may be removed in a state where an oxidation prevention member is applied on the surface of the metal layer after removing the metal oxide film.

In the manufacturing method of electrical parts according to the present invention, the metal layer may consist of a metal including at least one of nickel and iron.

Also, in the manufacturing method of electrical parts according to the present invention, a step of plating one kind selected out of palladium, an alloy including palladium and cobalt, and rhodium, on the surface of the metal layer may be included after the step of removing a photoresist.

The step of removing the photoresist in the manufacturing method of electrical parts according to the present invention may be done by ashing using a gas which includes a fluorine compound.

With the manufacturing method of electrical parts according to the present invention, since no metal fluoride film is formed on the surface of the metal layer by removing the metal oxide film generated as a result of polishing the metal layer, a good plating can be formed on the surfaces of the electrical parts, whereby contact resistance on the surfaces of the electrical parts can be decreased.

BRIEF DESCRIPTION OF THE DRAWING

FIGS. 9-1 and 9-2 are schematic sectional views illustrating an example of desirable state in which the metal layers shown in FIG. 8 are removed from the substrate.

DETAILED DESCRIPTION OF THE INVENTION

Figure 1:
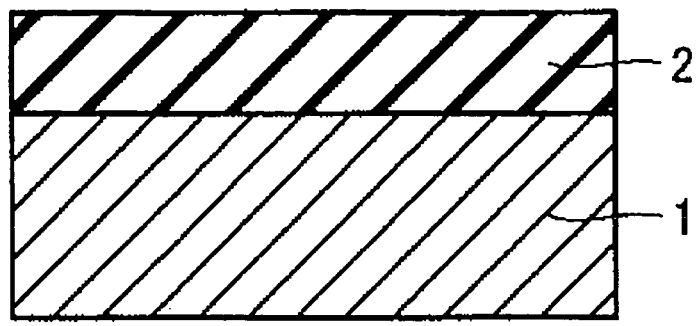
FIG. 1 is a schematic sectional view showing an example of desirable condition in which a photoresist is applied on the surface of a substrate used in the present invention.

Hereinafter, embodiments of the present invention will be described. In the drawings, the identical reference marks respectively indicate the same or corresponding parts.

EMBODIMENT 1

A preferable example of the manufacturing method of electrical parts according to the present invention will be described in reference to the drawings. First, as schematically shown in the sectional view of FIG. 1, a photoresist 2 is applied to the whole surface of a conductive substrate 1. In this case, the substrate 1 may be an electroconductive substrate made of stainless steel, copper or aluminum, etc. or may be a substrate in which a conductive layer is formed by sputtering titanium, aluminum, copper, or alloy of these metals on a non-electroconductive substrate made of silicon or glass, etc. As for the photoresist, a resin such as polymethyl methacrylate (PMMA), which includes carbon and hydrogen, is used, for example.

Figure 2:
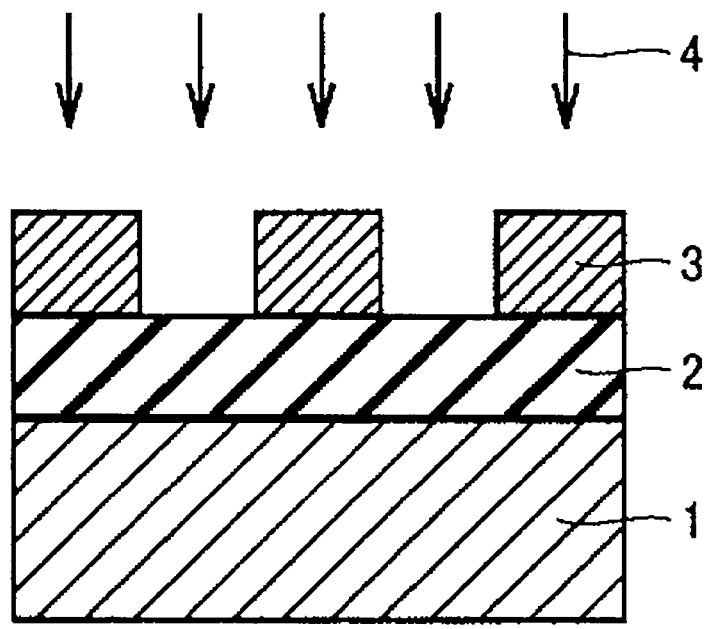
FIG. 2 is a schematic sectional view illustrating a state where SR light is being irradiated after a mask has been provided on the surface of the photoresist shown in FIG. 1.
Figure 3:
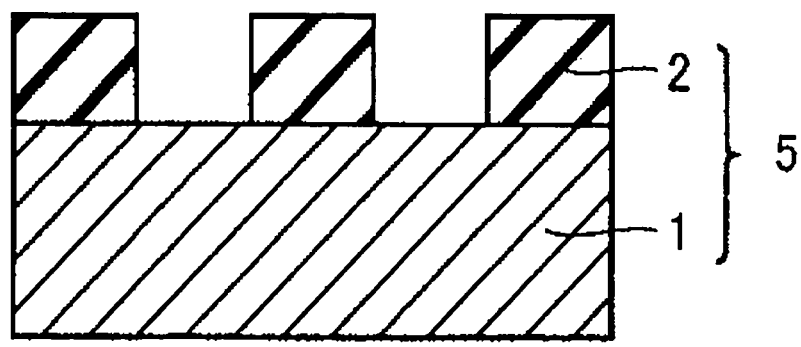
FIG. 3 is a schematic sectional view showing a desirable example of a master die used in the present invention.

Subsequently, as shown in the schematic sectional view of FIG. 2, after a mask 3 in which openings are formed in a desired pattern is placed on the surface of the photoresist 2, X-rays 4 are irradiated from a position above the mask 3. Then, as shown in the schematic sectional view of FIG. 3, the X-rays irradiated part of the photoresist 2 is removed and thereby a master die 5 in which the photoresist 2 is formed on a part of the surface of the substrate 1 is prepared.

Figure 4:
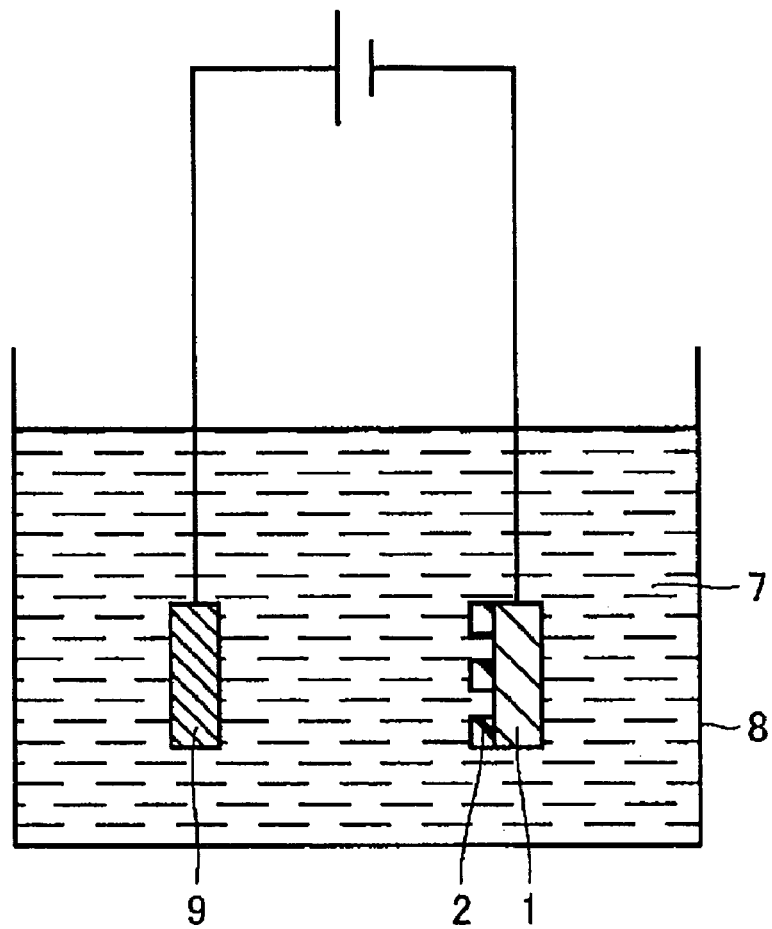
FIG. 4 is a schematic sectional view illustrating electroforming using the master die shown in FIG. 3.
Figure 5:
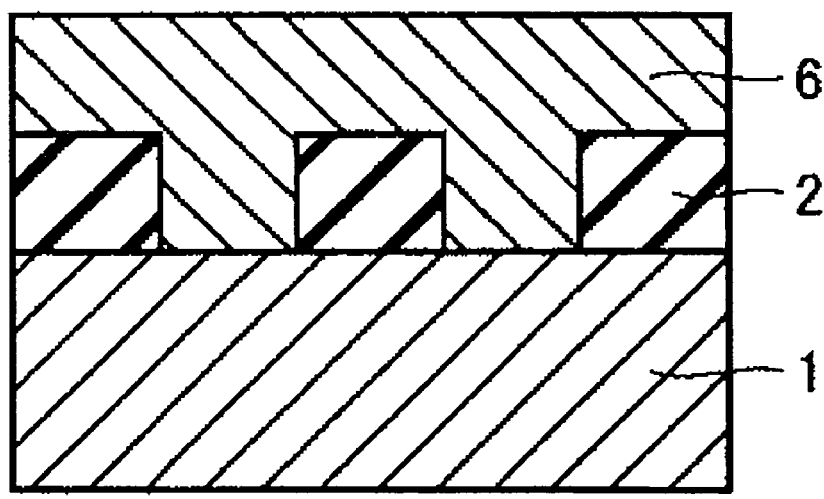
FIG. 5 is a schematic sectional view showing an example of a desirable condition in which a metal layer is deposited on the master die shown in FIG. 3.

Subsequently, as shown in the schematic diagram of FIG. 4, the master die, which is used as a cathode, is immersed with an anode 9 which is made of nickel, for example, in an electrolysis solution 7 which includes metal ion and which is contained in an electroplating bath 8. Then, by flowing an electrical current between these electrodes so as to perform electroforming, the metal ion in the electrolysis solution 7 is reduced such that metal deposits on the substrate 1, and as shown in the schematic sectional view of FIG. 5, a metal layer 6 is formed on the surface of the substrate 1. Subsequently, after the master die is taken out from the electroplating bath, a part of the metal layer 6 is removed by polishing so that the surface of metal layer 6 has the same level in terms of height as the surface of the photoresist 2. During the time of such processing, metal oxide film 10 are formed on the surfaces of the metal layers 6, as shown in the schematic sectional view of FIG. 6. It is assumed that oxygen in the atmosphere and metal in the surfaces of the metal layers 6 combine together such that the metal oxide films 10 are formed.

Figure 6:
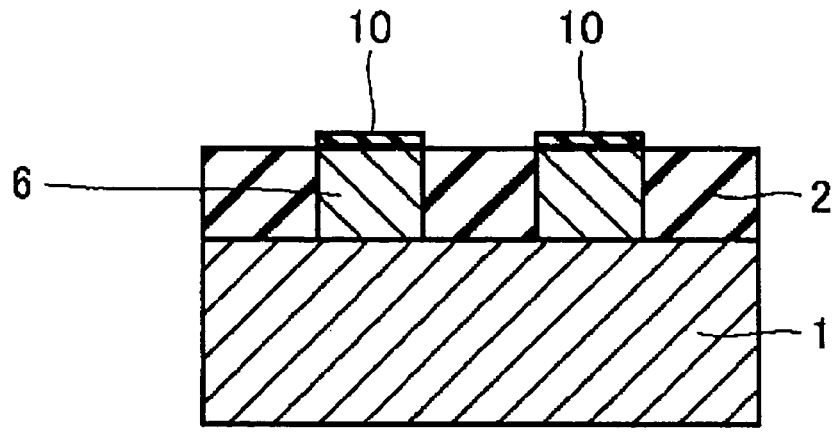
FIG. 6 is a schematic sectional view showing an example of a desirable condition in which metal oxide films are formed on the surfaces of the metal layer shown in FIG. 5.
Figure 7:
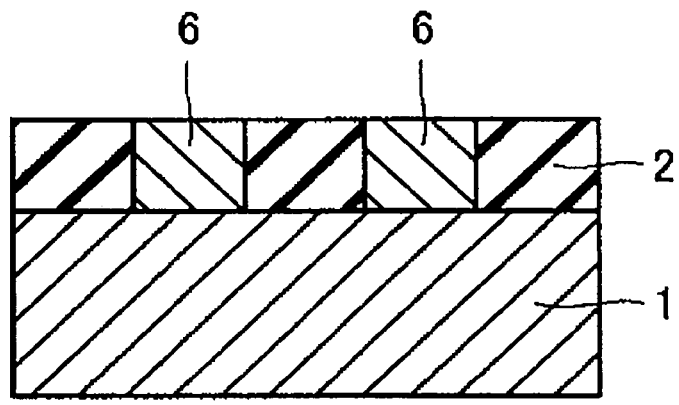
FIG. 7 is a schematic sectional view showing an example of desirable condition in which the metal oxide films shown in FIG. 6 are removed.

Then, the metal oxide films 10 on the surface of the metal layers 6 shown in FIG. 6 are removed as shown in the schematic sectional view of FIG. 7. In this case, the metal oxide films 10 can be removed, for example, chemically with a strong acid of 1 pH or less, hydrofluoric acid, organic acid, ethylenediaminetetraacetic acid (EDTA), quaternary ammonium imide compound, or ammonia and hydrogen peroxide mixture (solution made by mixing ammonia water and hydrogen peroxide water), etc., or can be removed by physical etching. It is also possible to remove the metal oxide films 10 by electro-polishing in dilute sulfuric acid, or by an electrochemical method in which a voltage is applied between one electrode and the metal layer 6, on which metal oxide film 10 is formed and which is used as another electrode, at a level that does not cause the metal layer 6 to be eluted.

Figure 8:
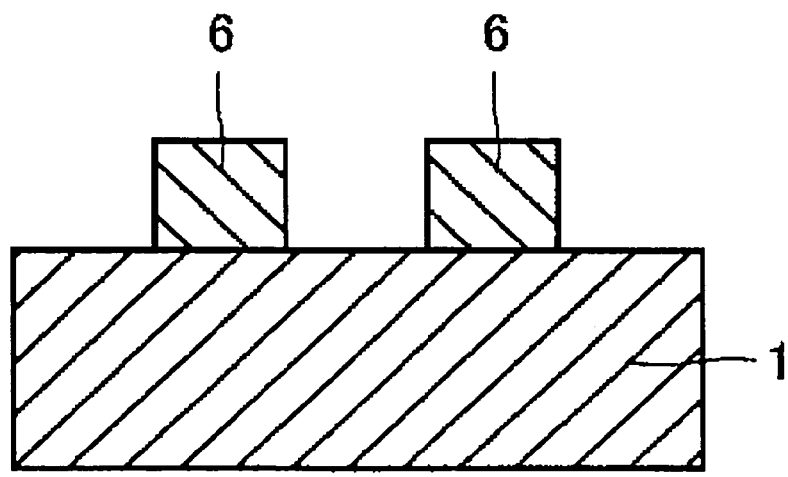
FIG. 8 is a schematic sectional view illustrating an example of desirable state in which the photoresist shown in FIG. 7 is removed.
Figures 1, 9:
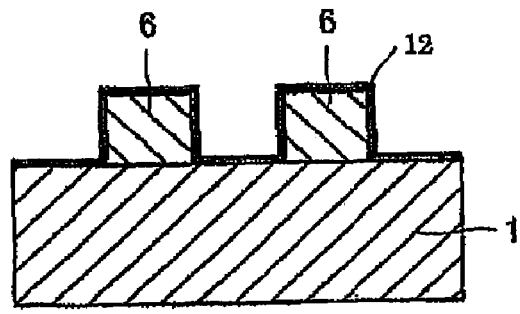
Figures 2, 9:
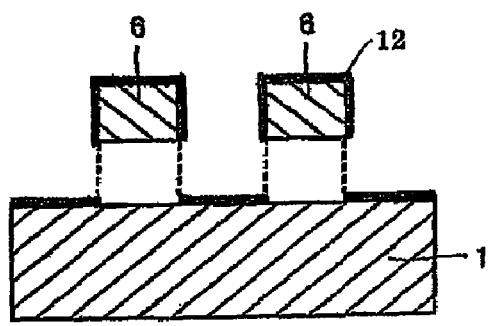

Subsequently, by performing ashing by means of plasma using a gas which includes oxygen and fluorine compound such as carbon tetrafluoride or xenon fluoride, for example, the photoresist 2 on substrate 1 is removed as shown in the schematic sectional view of FIG. 8. In this case, since there is no metal oxide film existing on the surface of the metal layer 6, no metal fluoride film is formed by reaction between the metal oxide film and HF which is the resolution product of the gas used for ashing. Thereafter, as shown in the schematic sectional view of FIG. 9, the metal layers 6 are removed from the substrate 1. Thus, electrical parts (metal layers 6) of the present invention are obtained. In the electrical parts of the present invention in which no metal fluoride film is formed, it is possible to reduce contact resistance on the surfaces of the electrical parts.

The electrical parts that can be obtained as described above, according to the present invention are, for example, contact probes, micro connectors, miniature relays, and various sensor parts. Also, the examples of the electrical parts obtained by the present invention are variable condensers, inductors, Radio Frequency Micro Electro Mechanical System (RFMEMS) such as arrays or antennas, optical MEMS members, ink-jet heads, electrodes in a biosensor, or power MEMS members (electrodes, etc.).

If the metal layer 6 is made of at least one of nickel and iron, the present invention is preferably applied since the metal oxide film 10 is easily formed after polishing of the metal layer 6. Such metals consisting of at least one of nickel and iron are, for example, nickel itself, an alloy consisting of nickel and manganese (Ni—Mn alloy), an alloy consisting of nickel and iron (Ni—Fe alloy), an alloy consisting of nickel and cobalt (Ni—Co alloy), an alloy consisting of nickel and chrome (Ni—Cr alloy), an alloy consisting of iron and chrome (Fe—Cr alloy), and an alloy consisting of nickel, iron, and chrome (Ni—Fe—Cr alloy).

In the present invention, one kind of metal selected from palladium, an alloy consisting of palladium and cobalt, or rhodium may be applied by electroplating or electroless plating on the surface of the metal layer 6 in a state where the metal layer 6 has been formed on the substrate 1 or after the metal layer 6 has been removed from the substrate 1. If the above-mentioned metals are plated by electroplating without the step of removing the metal oxide film 10 on the surface of the metal layer 6, it sometimes is not possible to accomplish plating because of conduction failure due to the formation of a metal fluoride film, and even if plating is done, the resulting plating film has irregularities. In the case of electroless plating, the adhesion of the plating film becomes degraded due to the existence of the metal fluoride film. However, if the step of removing the metal oxide film 10 on the surface of the metal layer 6 is performed as in the present invention, it is possible to form a plating film capable of high adhesion without irregularities by electroplating or electroless plating the above-mentioned metals since no metal fluoride film is formed on the surface of the metal layer 6.

EMBODIMENT 2

Figure 10:
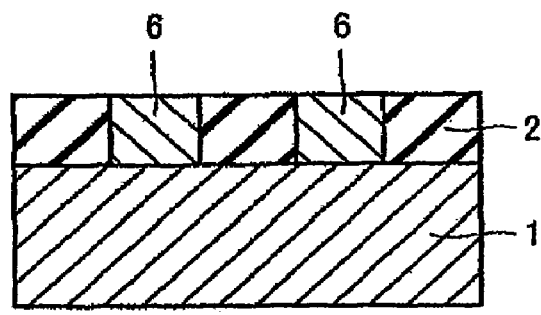
FIG. 10 is a schematic sectional view illustrating an example of desirable state in which the metal oxide films have been removed from the metal layers on the surface of the substrate used in the present invention.
Figure 11:
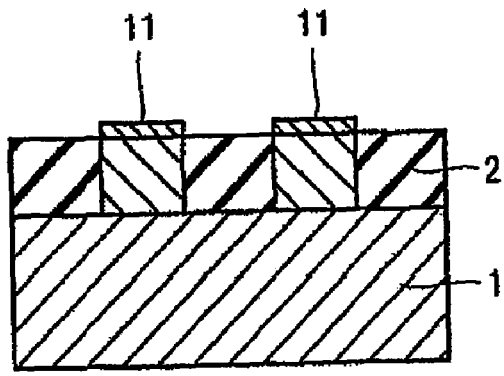
FIG. 11 is a schematic sectional view illustrating an example of desirable state in which the oxidation prevention members are provided on the surfaces of the metal layers shown in FIG. 10.

In reference to the drawings, another preferable example of the manufacturing method of electrical parts according to the present invention will be described hereinafter. First, as shown in the schematic sectional view of FIG. 10, the steps of manufacture until the step of removing the metal oxide film formed on the surface of the metal layer 6 are the same as in the above-described embodiment 1. Next, as shown in the schematic sectional view of FIG. 11, oxidation prevention members 11 are provided on the surfaces of the metal layers 6. The oxidation prevention member 11 is not particularly limited if it can prevent the oxidation of the surface of the metal layer 6: it may be formed by electroplating with a metal such as copper, for example.

Figure 12:
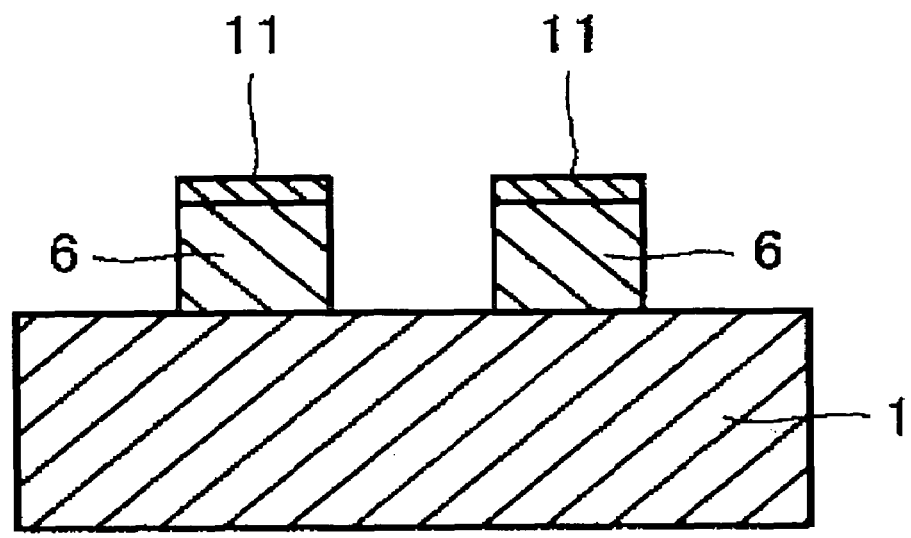
FIG. 12 is a schematic sectional view illustrating an example of desirable state in which the photoresist shown in the FIG. 11 is removed.
Figure 13:
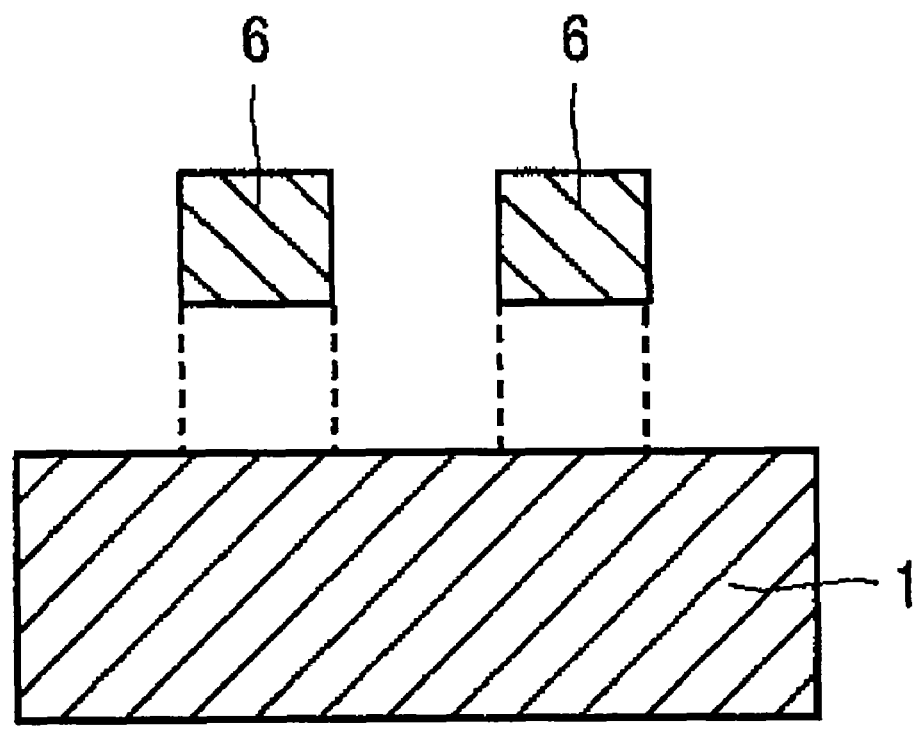
FIG. 13 is a schematic sectional view illustrating an example of desirable state in which the metal layers shown in FIG. 12 are removed from the substrate.

As shown in the schematic sectional view of FIG. 12, the photoresist 2 on the substrate 1 is removed by performing ashing by means of plasma using a gas which includes oxygen and fluorine compound such as carbon tetrafluoride or xenon fluoride. In this case, since the oxidation prevention members 11 are provided on the surfaces of the metal layers 6, no metal fluoride films are formed on the surfaces of the metal layers 6. Thereafter, the oxidation prevention members 11 are removed from the surface of the metal layers. The oxidation prevention members 11 can be removed by immersing them in an ammonia and hydrogen peroxide mixture, a sulfuric acid ammonium solution, or an ammonia solution, etc. Then, as shown in the schematic sectional view of FIG. 13, the metal layers 6 are removed from the substrate 1, and electrical parts (metal layers 6) of the present invention are obtained. Since there is no metal fluoride films formed on the surfaces of the electrical parts which are thus obtained according to the present invention, it is possible to reduce contact resistance on the surfaces of the electrical parts.

As for description about other part of the above-mentioned embodiment 2, it is omitted because it is the same as the above-described embodiment 1.

EXAMPLES

Example 1

A photoresist consisting of PMMA was applied onto the whole surface of a substrate made of stainless steel, and after irradiating synchrotron radiation (SR), which is X-ray, to a part of the photoresist, the irradiated part of the photoresist was removed to expose the surface of the substrate so that the photoresist having openings with the removed parts of 60 μm width, 1 mm length and 60 μm depth was formed.

The master die thus prepared was used as a cathode and a nickel board was used as an anode such that these electrodes were put in an electrolysis solution of pH 4.0 having the following composition and contained in an electroplating bath. Thus, electroforming was performed while the electrolysis solution was maintained at a temperature of 60° C. and an electric current with an electric current density of 4A/dm$^2$ was caused to flow between these electrodes. The notation of the compositions of the electrolysis solution described below represents the mass or volume of each ingredient per 1 L of the electrolysis solution. The rest of the electrolysis solution except for the ingredients described in the following composition is water.

<Composition of the Electrolysis Solution>
 Nickel sulfamate: 600 g/L
 Nickel chloride: 10 g/L
 Boric acid: 40 g/L After depositing a nickel layer on the substrate by electroforming as described above, the surface of the nickel layer and the surface of the photoresist were made to have the same height by polishing and removing the nickel part that protrudes above the level of the surface of the photoresist. Then, a surface treating agent of strong acid available on the market ("KOKEISAN RP" made by Kizai Corporation) was applied onto the surface of the nickel layer so that the nickel oxide film formed by polishing on the surface of the nickel layer was removed. Subsequently, using a mixed gas in which the volume ratio of oxygen and carbon tetrafluoride was 1:1, ashing was performed under the following conditions to remove the photoresist.

<Condition of Ashing>
 Mixed gas pressure: 0.5 torr
 Electric power: 100 W
 Processing time: 200 minutes After the above-mentioned ashing, the surfaces of the electrical parts thus obtained by removing the nickel layers from the substrate were subjected to Auger electron spectroscopy (AES) analysis, with which no fluorine was detected. When electroplating was performed under the following plating conditions onto the surfaces of the electrical parts, satisfactory rhodium plating films were formed on the whole surfaces. These results proved that in this Example the formation of nickel fluoride thin films was prevented, and electrical parts having a satisfactory rhodium plating film without irregularities were obtained. In the following plating conditions, all ingredient except for those described as ingredients for the plating bath is water.

<Plating Conditions>
 Plating bath: sulfuric acid rhodium 1.5 g/L; Sulfuric acid 20 ml/L
 Bath temperature: 50° C.
 Electric current density: 2 A/dm$^2$
 Anode: platinum board
 Time: 100 seconds

Example 2

In a similar manner as in Example 1, after depositing a nickel layer by electroforming on a substrate made of stainless steel of a master die, the nickel layer was polished so as to have the same surface level in terms of height as the surface of the photoresist. Then, after removing a nickel oxide film on the surface of the nickel layer by using the same surface treatment agent as in Example 1, a copper plating film was formed in 3 μm thickness as an oxidation prevention member on the surface of the nickel layer. Subsequently, the photoresist was removed by performing ashing under the same condition as Example 1.

The substrate obtained after the above-mentioned ashing was immersed in an ammonia and hydrogen peroxide mixture so as to dissolve only the copper plating film on the surface of the nickel layer.

Thereafter, as in Example 1, electrical parts obtained by removing the nickel layers from the substrate were subjected to AES analysis, with which no fluorine was detected. Also, plating was done under the same conditions as in Example 1, it was possible to accomplish satisfactory plating on the whole surfaces. From these results, it was confirmed also in this Example that the formation of a nickel fluoride thin film was prevented, and electrical parts having a satisfactory plating film without irregularity were obtained.

Comparative Example 1

Electrical parts were made by the same method as in Example 1 except that a nickel oxide film formed on the surface of the nickel layer was not removed by polishing. When the electrical parts were subjected to AES analysis in the same manner as in Example 1, fluorine was detected in about 2 nm thickness on the surface of the electrical parts.

Also, when plating was performed on these electrical parts under the same conditions as in Example 1, no rhodium plating film was formed on the surface that corresponds to the otherwise polished surface of the nickel layer after electroforming.

Comparative Example 2

In the same manner as Comparative Example 1, Samples No. 1 to No. 6 as shown in Table I were prepared until ashing was performed, and they were subjected to pre-plating treatment using various surface treatment agents respectively as shown in Table I. Subsequently, they were subjected to an attempt of removing a nickel fluoride thin film formed on the surfaces of the metal layers. Then, the samples, to which the pre-plating treatment were done, were subjected to plating under the same conditions as Example 1. Table I shows the conditions of the pre-plating treatment and the results of the plating. In Table I, "%" means a mass %, "treatment temperature" means the temperature of the respective surface treatment agent, and "treatment time" means time during which nickel layers were immersed in the respective surface treatment agents. Also, the symbol "x" in the columns of plating result in Table I indicates that it was impossible to accomplish plating.

TABLE I

| Sample No. | Surface treatment agent | Treatment temperature | Treatment time (Min.) | Plating result |
|---|---|---|---|---|
| 1 | 1% HF solution | 50° C. | 5 | X |
| 2 | 20% Hydrogen chloride solution | 55° C. | 5 | X |
| 3 | 5% Hydrogen chloride solution | 55° C. | 30 | X |
| 4 | 10% Sodium hydrate solution | 55° C. | 10 | X |
| 5 | Acetone | 25° C. | 10 | X |
| 6 | Kokeisan RP | 55° C. | 3 | X |

As shown in Table I, it was found that in all of the cases no satisfactory plating was accomplished and no nickel fluoride thin films could be removed.

It should be noted that all of the embodiments and Examples disclosed in this specification are exemplary and not restrictive in all respects. The scope of the present invention is intended to be shown by claims and not by the above description, and it is intended to include all changes in the claims and in the range and meaning of equivalences.

What is claimed is:

1. A method of manufacturing electrical parts, comprising the following sequential steps of:
   forming a photoresist on a part of the surface of a substrate;
   forming a metal layer on the surface of the substrate after the photoresist has been formed;
   removing a part of the metal layer;
   removing a metal oxide film formed on the surface of the metal layer as a result of removing a part of the metal layer;
   removing the photoresist; and
   following the step of removing the photoresist, forming a plating film on the surface of the metal layer at a position where the metal oxide was removed and the photoresist was directly connected to and was removed from the metal layer, the plating film being selected from palladium, rhodium, or an alloy including palladium and cobalt.

2. A method of manufacturing electrical parts according to 1, wherein the metal layer is formed on the surface of the substrate by electroforming.

3. A method of manufacturing electrical parts according to claim 1, wherein the photoresist is removed in a state where an oxidation prevention member is applied on the surface of the metal layer after removing the metal oxide film.

4. A method of manufacturing electrical parts according to claim 1, wherein the metal layer comprises a metal including at least one of nickel and iron.

5. A method of manufacturing electrical parts according to claim 1, wherein step of removing the photoresist is done by ashing using a gas which includes a fluorine compound.

* * * * *